US006670640B1

(12) United States Patent
Yamazaki et al.

(10) Patent No.: US 6,670,640 B1
(45) Date of Patent: Dec. 30, 2003

(54) METHOD FOR PRODUCING SEMICONDUCTOR DEVICE

(75) Inventors: Shunpei Yamazaki, Tokyo (JP); Naoto Kusumoto, Kanagawa (JP); Satoshi Teramoto, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 0 days.

(21) Appl. No.: 09/327,473

(22) Filed: Jun. 8, 1999

(65) Prior Publication Data (65)

(30) Foreign Application Priority Data

Sep. 15, 1994 (JP) .............................. 6-248790
May 6, 1995 (JP) .............................. 7-132901

(51) Int. Cl.[7] .................................... H01L 29/786
(52) U.S. Cl. ............................ 257/66; 257/72
(58) Field of Search .................... 257/66, 72

(56) References Cited

U.S. PATENT DOCUMENTS

| 4,266,986 A | | 5/1981 | Benton et al. ............... 437/19 |
| 5,047,861 A | * | 9/1991 | Houchin et al. ....... 358/213.15 |
| 5,147,826 A | | 9/1992 | Liu et al. .................... 437/233 |
| 5,157,781 A | * | 10/1992 | Harwood ................... 395/575 |
| 5,275,851 A | | 1/1994 | Fonash et al. ............. 427/578 |
| 5,313,222 A | | 5/1994 | Lee |
| 5,403,762 A | | 4/1995 | Takemura .................... 437/40 |
| 5,403,772 A | | 4/1995 | Zhang et al. ................ 437/101 |
| 5,426,064 A | | 6/1995 | Zhang et al. ................ 437/40 |
| 5,488,000 A | * | 1/1996 | Zhang ........................ 437/21 |
| 5,488,243 A | | 1/1996 | Tsuruta et al. |
| 5,523,240 A | | 6/1996 | Zhang et al. ................ 437/21 |
| 5,529,937 A | | 6/1996 | Zhang et al. ................ 437/10 |
| 5,680,149 A | * | 10/1997 | Koyama |
| 5,731,613 A | | 3/1998 | Yamazaki et al. |
| 5,784,311 A | * | 7/1998 | Assaderaghi ............... 365/150 |
| 5,790,839 A | * | 8/1998 | Luk et al. .................... 395/556 |
| 5,849,601 A | | 12/1998 | Yamazaki |
| 5,858,823 A | | 1/1999 | Yamazaki et al. |
| 5,879,977 A | * | 3/1999 | Zhang ........................ 257/66 |
| 5,962,897 A | * | 10/1999 | Takemura .................... 257/66 |

FOREIGN PATENT DOCUMENTS

| CN | 1090652 | 8/1994 |
| JP | 60-105216 | 6/1985 |
| JP | 2-140915 | 5/1990 |
| JP | 06-045598 | 2/1994 |
| JP | 06-163899 | 6/1994 |
| JP | 06-224433 | 8/1994 |

OTHER PUBLICATIONS

C. Hayzelden et al., "In Situ Transmission Electron Microscopy Studies of Silicide–Mediated Crystallization of Amorphous Silicon", Appl. Phys. Lett. vol. 60, No. 2, Jan. 13, 1992, pp. 225–227.

A.V. Dvurechenskii et al., "Transport Phenomena in Amorphous Silicon Doped by Ion Implantation of 3d Metals", Phys. Stat. Sol. (a) vol. 95, (1986), pp. 635–640.

(List continued on next page.)

Primary Examiner—Jerome Jackson
(74) Attorney, Agent, or Firm—Nixon Peabody LLP; Jeffrey L. Costellia (57) ABSTRACT

In a producing a thin film transistor, a solution containing a metal element for promoting crystallization of silicon is added in contact with an amorphous silicon film, and then a silicide layer is formed by heating process. Further, after a region as crystal growth nucleus is formed by patterning the silicide layer, laser light is irradiated while heating process. As a result, crystal-growth is performed from the region as crystal growth nucleus in the amorphous silicon film, thereby to form monodomain regions corresponding to a single crystal. Also, before the solution is added, the amorphous silicon film may be subjected to plasma treatment 30.

41 Claims, 5 Drawing Sheets

OTHER PUBLICATIONS

T. Hempel et al., "Needle–Like Crystallization of Ni doped Amorphous Silicon Thin Films", Solid State Communications, vol. 85, No. 11, Mar. 1993, pp. 921–924.

R. Kakkad et al., "Crystallized Si Films by Low–Temperature Rapid Thermal Annealing of Amorphous Silicon", J. Appl. Phys., vol. 65, No. 5, Mar. 1, 1989, pp. 2069–2072.

G. Liu et al., "Polycrystalline Silicon Thin Film Transistors on Corning 7059 Glass Substrates Using Short Time, Low-Temperature Processing", Appl. Phys. Lett., vol. 62, No. 20, May 17, 1993, pp. 2554–2556.

G. Liu et al., Selective Area Crystallization of Amorphous Silicon Films by Low–Temperature Rapid Thermal Annealing, Appl. Phys. Lett., vol. 55, No. 7, Aug. 14, 1989, pp. 660–662.

R. Kakkad et al., "Low Temperature Selective Crystallization of Amorphous Silicon", Journal of Non–Crystalline Solids, vol. 115, 1989, pp. 66–68.

* cited by examiner

IMPURITY ION IMPLANTATION AND LASER LIGHT IRRADIATION

IMPURITY ION IMPLANTATION AND LASER LIGHT IRRADIATION

FIG.5D

METHOD FOR PRODUCING SEMICONDUCTOR DEVICE

BACKGROUND OF THE INVENTION

1. Field of the Invention

The present invention relates to a method for producing a semiconductor device using a thin film of a crystalline semiconductor, and particularly, to a method for producing a thin film transistor.

2. Description of the Related Art

Recently, much attention is paid on transistors which utilize a thin film of a semiconductor formed on a glass or quartz substrate. Such thin film transistors (TFTs) are fabricated by forming a thin film semiconductor from several hundreds to several thousands of angstroms (Å) in thickness on the surface of a glass substrate or a quartz substrate, and then forming a transistor (insulated gate field effect transistor) using the thin film semiconductor.

TFTs are used in an application field such as that of an active matrix type liquid crystal display device. An active matrix type liquid crystal display device has several hundred thousands of pixels arranged in a matrix, and TFTs are provided to each of the pixels as switching elements to realize a fine and a high speed display. Practically available TFTs designed for an active matrix type liquid crystal display device utilize thin films of amorphous silicon.

However, TFTs based on thin films of amorphous silicon are still inferior in performance. If a higher function is required as a liquid crystal display of an active matrix type, the characteristics of TFTs utilizing an amorphous silicon film are too low to satisfy the required level.

Furthermore, it is proposed to fabricate an integrated liquid crystal display system on a single substrate by using TFTs; i.e., by realizing not only the pixel switching, but also the peripheral driver circuit with TFTs. However, a TFT using an amorphous silicon thin film cannot constitute a peripheral driver circuit because of its low operation speed. In particular, a basic problem is that a CMOS circuit is unavailable from an amorphous silicon thin film due to the difficulty in implementing a practical P-channel type TFT by using amorphous silicon thin film (i.e., the TFT using amorphous silicon thin film is practically unfeasible due to its too low performance).

Another technology is proposed to integrate other integrated circuits and the like for processing or recording image data, etc., on a single substrate together with the pixel regions and the peripheral driver circuits. However, a TFT using a thin film of amorphous silicon is too inferior in characteristics to constitute an integrated circuit capable of processing image data.

On the other hand, there is a technology of fabricating a TFT using a crystalline silicon film which is far superior in characteristics as compared with the one using a thin film of amorphous silicon. The technology comprises forming a film of amorphous silicon and then modifying (transforming) the resulting film of amorphous silicon to a crystalline silicon film by subjecting the amorphous silicon film to thermal treatment or to laser irradiation. The crystalline silicon film thus obtained by crystallizing the amorphous silicon film generally yields a polycrystalline structure or a microcrystalline structure.

As compared with a TFT using an amorphous silicon film, a TFT having far superior characteristics can be implemented by using a film of crystalline silicon. Concerning mobility, which is one of the indices for evaluating TFTs, a TFT using amorphous silicon film has 1 to 2 $cm^2/Vs$ or lower (in an N-channel type), but a TFT using a crystalline silicon film enables a mobility of about 100 $cm^2/Vs$ or higher in an N-channel type, or about 50 $cm^2/Vs$ or higher in a P-channel type.

The crystalline silicon film obtained by crystallizing an amorphous silicon film has a polycrystalline structure, and hence various problems attributed to the grain boundaries arise. For instance, carriers which move through the grain boundaries greatly limit the withstand voltage of the TFT. The change or degradation in characteristics easily occurs in high speed operation. Further, the carriers which move through the grain boundaries increase the OFF current (leak current) when the TFT is turned off.

In fabricating a liquid crystal display device of an active matrix type in a higher integrated constitution, it is desired to form not only the pixel region but also the peripheral circuits on a single glass substrate. In such a case, it is required that the TFTs provided in the peripheral circuit operate a large current to drive several hundred thousands of pixel transistors arranged in the matrix.

A TFT of a structure having a wide channel width must be employed to operate a large current. However, even if the channel width should be extended, a TFT using a crystalline silicon film cannot be put into practice because of the problems of withstand voltage. The large fluctuation in threshold voltage is another hindrance in making the TFT practically feasible.

A TFT using a crystalline silicon film cannot be applied to an integrated circuit in processing image data because of problems concerning the fluctuation in threshold voltage and the change in characteristics with passage of time. Accordingly, a practically feasible integrated circuit based on the TFTs which can be used in the place of conventional ICs cannot be realized.

SUMMARY OF THE INVENTION

An object of the present invention is to provide a thin film transistor (TFT) free from the influence of grain boundaries.

Another object of the present invention is to provide a TFT having a high withstand voltage and which is capable of operating large current.

A still other object of the present invention is to provide a TFT free from degradation or fluctuation in characteristics.

A yet other object of the present invention is to provide a TFT having characteristics corresponding to those of a TFT using single crystal semiconductor.

The above objects can be accomplished by a method for producing a semiconductor device according to the present invention, comprising the steps of, forming an amorphous silicon film on a substrate having an insulating surface, holding a metal element which accelerates (promotes) the crystallization of silicon in contact with the amorphous silicon film, forming a layer containing the metal element on the surface of the amorphous silicon film by heat treatment, forming a layer as a crystal growth nucleus by patterning the layer containing the metal element, forming a region substantially free of grain boundaries in the amorphous silicon film by crystal growth from the layer as the crystal growth nucleus, and forming an active layer by using the crystal-grown region which is substantially free of grain boundaries.

In the above process, the substrates having an insulating surface include a glass substrate, a quartz substrate, a glass substrate with an insulating film formed thereon, a quartz substrate with an insulating film formed thereon, and a conductor substrate with an insulating film formed thereon. Also in a constitution of a three-dimensional integrated circuit, an insulating surface comprising an interlayer insulating film and the like can be used as a substrate.

Figure 1A:
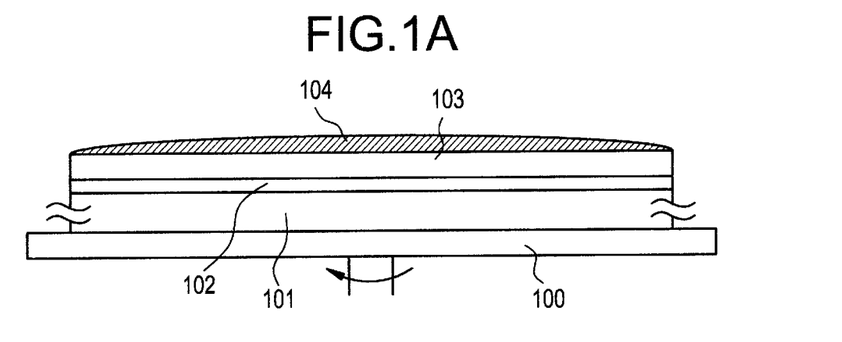
FIGS. 1A to 1E show the steps for fabricating a thin film silicon semiconductor having monodomain regions according to an embodiment of the present invention.

In the above process, the "step of holding a metal element which accelerates the crystallization of silicon in contact with the amorphous silicon film" can be performed by a constitution of FIG. 1A. In FIG. 1A, a solution containing nickel (a solution of nickel acetate) 104 is added to the surface of an amorphous silicon film 103 as a solution containing a metal element which accelerates the crystallization of silicon.

The state of holding a metal element which accelerates the crystallization of silicon in contact with the amorphous silicon film is realized in this manner. In this case, a solution containing the metal element is used, however, other methods for holding a metal element into contact with the surface of an amorphous silicon film can be employed. Such methods include forming a layer of the metal element or a layer containing the metal element on the amorphous silicon film by CVD, sputtering, or evaporation.

Figure 1B:
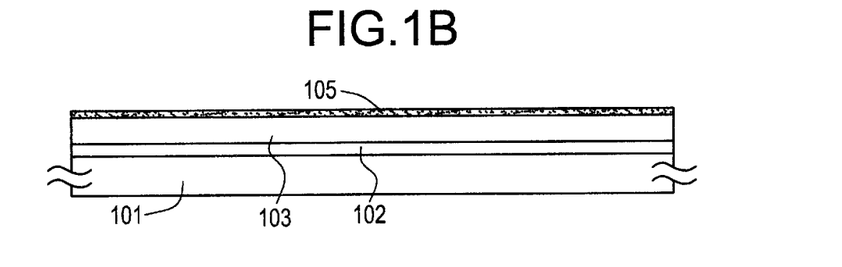

In the above process, the "step of forming a layer containing the metal element on the surface of the amorphous silicon film by a heat treatment" can include a step of FIG. 1B. In this step, baking at about 400° C. is effected to form a silicide layer 105 containing nickel and silicon.

Figure 1C:
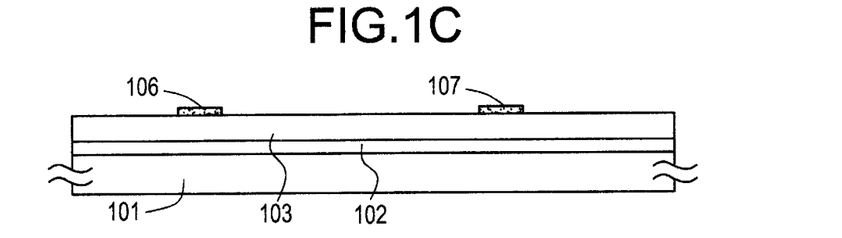

The step in FIG. 1C can be mentioned as the "step of forming a layer as a crystal growth nucleus by patterning the layer containing the metal element". The step comprises patterning the silicide layer 105 to form layers 106 and 107 as crystal growth nuclei in the later step.

Figure 1D:
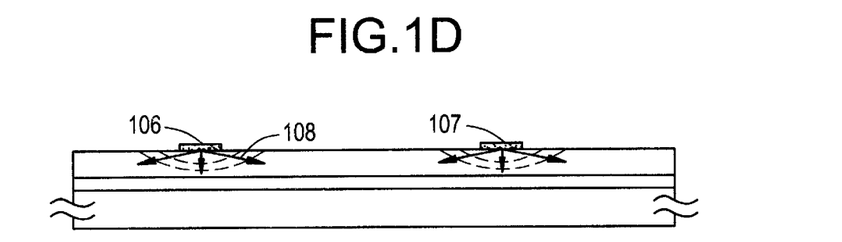
Figure 1E:
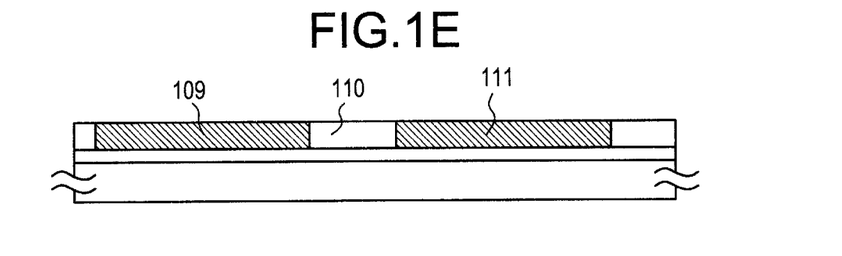

The steps of FIGS. 1D and 1E show the "step of forming a region substantially free of grain boundaries in the amorphous silicon film by crystal growth from the layer as the crystal growth nucleus". In FIG. 1D, laser light is irradiated while heating at 450 to 600° C. to allow a crystal growth 108 to occur from the selectively formed nickel silicide layers 106 and 107 on the amorphous silicon film, and thereby forming monodomain regions 109 and 111 which do not include internal grain boundaries.

In the invention disclosed in the specification, at least one selected from the group of Fe, Co, Ni, Ru, Rh, Pd, Os, Ir, Pt, Cu, and Au, or a combination of two or more thereof, can be mentioned as the metal elements for crystallizing silicon.

The region obtained substantially free of grain boundaries as a result of crystal growth is denoted as a monodomain region.

A monodomain region is free of point defects or planar defects which become grain boundaries, but has point defects to be neutralized. Thus, it is important that the monodomain region contain hydrogen or a hydrogen halide at a concentration of 0.001 to 5% by atomic for the neutralization. That is, hydrogen or hydrogen halide must be present at a concentration of $1 \times 10^{17}$ cm$^{-3}$ to $5 \times 10^{19}$ cm$^{-3}$ in the monodomain region to neutralize the point defects.

It is also a key that the monodomain regions contain the metal element for accelerating the crystallization of silicon at a concentration of $1 \times 10^{14}$ to $1 \times 10^{19}$ atoms·cm$^{-3}$. If the metal element should be present at a concentration not higher than the lower limit of the range defined above, the function of accelerating the crystallization would be achieved only insufficiently, and the required monodomain regions would be hardly obtained. If the metal element should be present at a concentration not lower than the upper limit of the range above, the semiconductive characteristics of the monodomain region obtained as a result would be greatly impaired.

The concentration referred above is defined as a minimum value based on the data obtained by SIMS (secondary ion mass spectroscopy). It should be noted, however, that the detection limit of SIMS at present for the metal element is $1 \times 10^{16}$ atoms·cm$^{-3}$. However, the concentration of the metal element can be approximated from the concentration of the metal element in the solution used for introducing the metal element. That is, the concentration beyond the limit of observed value by SIMS can be approximately calculated from the relation between the concentration of the metal element in the solution and the final concentration observed by SIMS for the metal element remaining in silicon film.

Two methods can be mentioned for the introduction of the metal element in effecting solid phase crystallization using the metal element for accelerating the crystallization.

One of the methods comprises forming an extremely thin film of the metal on the surface of the amorphous silicon film (or on the surface of the film provided under the amorphous silicon film) by a "physical method" such as sputtering or electron beam vapor deposition. In the methods above, the metal element is introduced into the amorphous silicon film by forming a film of the metal element in contact with the amorphous silicon film. In case this method is used, it is difficult to precisely control the concentration of the metal element to be introduced into the amorphous silicon film. Moreover, on an attempt to precisely control the quantity of the metal element to be introduced into the film by providing an extremely thin film about several tens of angstroms (Å), it becomes difficult to form a film in a complete form.

More specifically, island-like film portions of metal element is formed on the surface of the deposition plane. That is, a discontinuous layer is formed. This problem can be overcome by, for example, molecular beam epitaxy (MBE) and the like. However, in practice, MBE is only applicable to a limited area.

In case crystallization is effected after forming the above discontinuous layer, each of the island-like regions function as a nucleus to proceed the crystallization.

By careful observation of the crystalline silicon film thus obtained by the crystallization from the island-like regions, amorphous components are found to remain in a great number. This can be observed by using an optical microscope or on an electron micrograph. Otherwise, this can be confirmed through the measurements using Raman spectroscopy. It is also confirmed that the metal components remain in aggregates. This is believed to occur because the metal components which function as the nuclei of crystallization remain as they are in the nuclei region.

The region in which the metal components partially remain as aggregates function as recombination centers for electrons and holes in the crystallized semiconductor regions. These recombination centers induce particularly undesirable characteristics such as an increase in leak current of the TFT.

Otherwise, a metal element capable of accelerating the crystallization of silicon can be introduced into an amorphous silicon film by utilizing a solution containing the metal element. This method comprises incorporating the metal element into the solution, and adding the resulting solution to the surface of the amorphous silicon film or to the surface of the base film on which the amorphous silicon film is formed by spin coating and the like.

Several types of solution can be used depending on the metal element to be introduced into the amorphous silicon film. Representatively, a metal compound available in the form of a solution can be used. Examples of the metal compounds usable in the solution method are enumerated below.

(1) In case of using nickel (Ni), the nickel compound is at least one selected from the group consisting on nickel bromide, nickel acetate, nickel oxalate, nickel carbonate, nickel chloride, nickel iodide, nickel nitrate, nickel sulfate, nickel oxide, nickel hydroxide, nickel acetyl acetonate, nickel 4-cyclohexylacetate, and nickel 2-ethylhexanate. Otherwise, nickel may be mixed with a non-polar solvent which is at least one selected from the group consisting of benzene, toluene, xylene, carbon tetrachloride, chloroform, ether, trichloroethylene, and Fleon.

(2) When iron (Fe) is selected as the catalytic element, an iron salt selected from compounds such as ferrous bromide ($FeBr_2.6H_2O$), ferric bromide ($FeBr_3.6H_2O$), ferric acetate ($Fe(C_2H_3O_2)_3.xH_2O$), ferrous chloride ($FeCl_2.4H_2O$), ferric chloride ($FeCl_3.6H_2O$), ferric fluoride ($FeF_3.3H_2O$), ferric nitrate ($Fe(NO_3)_3.9H_2O$), ferrous phosphate ($Fe(PO_4)_2.8H_2O$), and ferric phosphate ($FePO_4.2H_2O$) can be used.

(3) In case cobalt (Co) is used as the catalytic element, useful compounds thereof include cobalt salts such as cobalt bromide ($CoBr.6H_2O$), cobalt acetate ($Co(C_2H_3O_2)_3.4H_2O$), cobalt chloride ($CoCl_2.6H_2O$), cobalt fluoride ($CoF_2.xH_2O$), and cobalt nitrate ($Co(NO_3)_2.6H_2O$).

(4) A compound of ruthenium (Ru) can be used as a catalytic element in the form of a ruthenium salt, such as ruthenium chloride ($RuCl_3.H_2O$).

(5) A rhodium (Rh) compound is also usable as a catalytic element in the form of a rhodium salt, such as rhodium chloride ($RhCl_3.3H_2O$).

(6) A palladium (Pd) compound is also useful as a catalytic element in the form of a palladium salt, such as palladium chloride ($PdCl_2.2H_2O$).

(7) In case osmium (Os) is selected as the catalytic element, useful osmium compounds include osmium salts such as osmium chloride ($OsCl_3$).

(8) In case iridium (Ir) is selected as the catalytic element, a compound selected from iridium salts such as iridium trichloride ($IrCl_3.3H_2O$) and iridium tetrachloride ($IrCl_4$) can be used.

(9) In case platinum (Pt) is used as the catalytic element, a platinum salt such as platinic chloride ($PtCl_4.5H_2O$) can be used as the compound.

(10) In case copper (Cu) is used as the catalytic element, a compound selected from cupric acetate ($Cu(CH_3COO)_2$), cupric chloride ($CuCl_2.2H_2O$), and cupric nitrate ($Cu(NO_3)_2.3H_2O$) can be used.

(11) In using gold (Au) as the catalytic element, it is incorporated in the form of a compound selected from auric trichloride ($AuCl_3.xH_2O$), auric hydrogenchloride ($AuHCl_4.4H_2O$), and sodium auric tetrachloride ($AuNaCl_4.2H_2O$).

Each of the compounds above can be sufficiently dispersed in the form of single molecules in a solution. The resulting solution is added dropwise to the surface on which the catalyst is to be added, and is subjected to spin-coating by rotating the surface at a rate in 50 to 500 revolutions per minute (RPM) to spread the solution over the entire surface. By previously forming a silicon oxide film at a thickness of 5 to 100 Å on the surface of the silicon semiconductor to enhance uniform wettability on the surface of the silicon semiconductor on which the film is formed, surface tension sufficiently prevents the solution from being scattered to form spots on the surface.

Further, the addition of an interface active agent into the solution realizes a uniformly wetted state on the surface of a silicon semiconductor having no silicon oxide film formed thereon.

In this method using a solution, a film of an organometallic compound containing a metal element is formed on the surface on which a film is to be formed.

The metal element which accelerates the crystallization of silicon is allowed to diffuse into the semiconductor in the form of atoms through the oxide film. In this manner, they can be diffused without positively forming (granular) crystal nucleus to uniformly crystallize silicon entirely. As a result, the metal element can be prevented from being partially concentrated or the amorphous component can be prevented from remaining in a large quantity.

The silicon semiconductor can be uniformly coated with an organometallic compound, and the resulting coating can be subjected to ozone treatment (i.e., treatment using ultraviolet radiation (UV) in oxygen). In such a case, a metal oxide film, and the crystallization proceeds from the resulting metal oxide film. Accordingly, the organic substance is oxidized and removed by volatilization in the form of gaseous carbon dioxide. Thus, a further uniform solid phase growth can be realized.

In case spin coating of the solution is effected by rotating at a low speed only, the metal component that is present in the solution on the surface tends to be supplied onto the semiconductor film at a quantity more than is necessary for the solid phase growth. Accordingly, after rotating at a low revolution rate, the spin coating is effected by rotating the substrate at 1,000 to 10,000 RPM, typically 2,000 to 5,000 RPM. The organometallic compound that is present in excess can be spun off by rotating the substrate at high rate, and the metal component can be supplied at an optimum quantity.

The quantity of the metal component to be introduced into the silicon semiconductor can be adjusted by controlling the concentration of the metal component in the solution. This method is particularly useful, because the concentration of the metal element to be finally introduced into the silicon film can be accurately controlled.

In the method of introducing the metal element using the solution, a continuous layer can be formed on the surface of the semiconductor (or on the surface of the undercoating thereof) without forming island-like regions of metal particles for the crystallization. Then, a uniform and dense crystal growth can be effected by a crystallization process by heat treatment or laser irradiation.

In the foregoing, an example of using a solution is described, but a similar effect as that obtained above can be obtained by forming the film by CVD using a gaseous metal compound, and particularly, a gaseous organometallic compound.

The method using a solution in forming a layer containing a metal element which accelerates the crystallization of amorphous silicon can be considered as a chemical method. The method for forming the layer by sputtering and the like as described above can be said as a physical method. The physical method can be considered as a non-uniform "anisotropic crystal growth method" using metal nucleus, whereas the chemical method can be considered as a method for uniform crystal growth, i.e., an "isotropic crystal growth" using a uniform metal catalyst.

DETAILED DESCRIPTION OF THE PREFERRED EMBODIMENTS

EXAMPLE 1

The example refers to a case of selectively forming monodomain regions by forming an amorphous silicon film on a substrate having an insulating surface, followed by selectively forming a layer containing a metal element which accelerates (promotes) the crystallization of silicon on the surface of the formed amorphous silicon film, and allowing crystal growth to occur from the formed layers containing the metal element provided as crystal nucleus.

FIGS. 1A to 1E show the fabrication process according to the example. A silicon oxide film is formed at a thickness of 3,000 Å by sputtering as a base film 102 on a glass substrate 101. The base film 102 functions as a barrier layer which prevents alkali ions or impurities from diffusing from the glass substrate 101. An insulating film which functions as a barrier can be used as the base film 102. For example, a silicon nitride film can be used.

After forming the base film 102, an amorphous silicon film 103 is formed at a thickness of 500 Å by plasma CVD or low pressure thermal CVD. Monodomain regions are formed in the amorphous silicon film in the process described later.

Then, a solution 104 containing nickel as a metal element which accelerates the crystallization of silicon is added (spin coated) by using a spinner 100. The quantity of metal nickel to be introduced (quantity of nickel addition) can be adjusted by controlling the concentration of nickel in the solution 104. By controlling the concentration of metal nickel, the concentration of nickel which finally remains in the monodomain region can be controlled. In this example, a solution of nickel acetate is used as the solution 104 containing nickel. In this manner, a state in which nickel is introduced over the entire surface of the amorphous silicon film 103 is realized; i.e., a state in which nickel is in contact with the entire surface of the amorphous silicon film 103 is realized (FIG. 1A).

In the example, nickel is introduced by using a solution. However, a layer of nickel or a layer containing nickel can be formed on the surface of the amorphous silicon film 103 by sputtering, CVD, or evaporation.

Then, heat treatment is performed for 1 hour at 300 to 500° C., in this case, 400° C. In this manner, a layer 105 of nickel silicide is formed on the surface of the amorphous silicon film 103 (FIG. 1B).

By patterning the resulting layer 105 of nickel silicide, layers 106 and 107 are formed in the amorphous silicon film 103 to provide crystal nucleus for forming monodomain regions (FIG. 1C).

While heating at 450 to 600° C., laser light irradiation is performed. The upper limit of the heating temperature. depends on the heat resistant temperature of the substrate. In this step, crystal growth occurs from the layers 106 and 107 provided as crystal nucleus (FIG. 1D).

In FIG. 1E, monodomain regions 109 and 111 which can be regarded as single crystals are obtained through process steps in FIGS. 1A to 1D. In FIG. 1E, an amorphous region 110 remains on the surface.

EXAMPLE 2

The present example refers to a case of forming a pair of N-channel and P-channel thin film transistors (TFTs) by applying the process for forming monodomain regions as described in Example 1. The example refers particularly to a case of forming only one pair of TFTs on a glass substrate, but it is possible to form a plurality of TFTs by a similar process of fabrication.

Figure 2A:
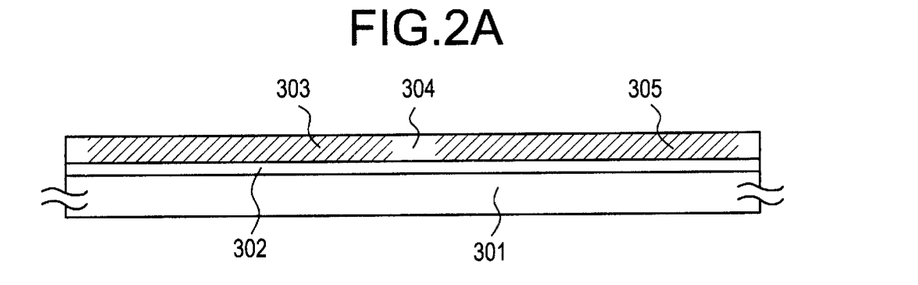
FIGS. 2A to 2D show the steps for fabricating a thin film transistor according to an embodiment.

By a process in Example 1, monodomain regions 303 and 305 are formed on a glass substrate 301 on which a 3,000 Å thick silicon oxide film is formed previously as a base film 302 (FIG. 2A).

Figure 2B:
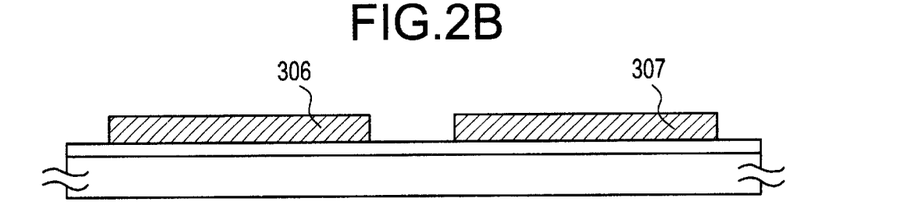

Then, patterning is effected to form active layers 306 and 307 for the two TFTs. In FIG. 2B, the active layer 306 is for the N-channel TFT, and the active layer 307 is for the P-channel TFT (FIG. 2B).

In the example, the active layers 306 and 307 are formed entirely inside the monodomain regions; at least the channel forming regions must be formed inside the monodomain regions.

Figure 2C:
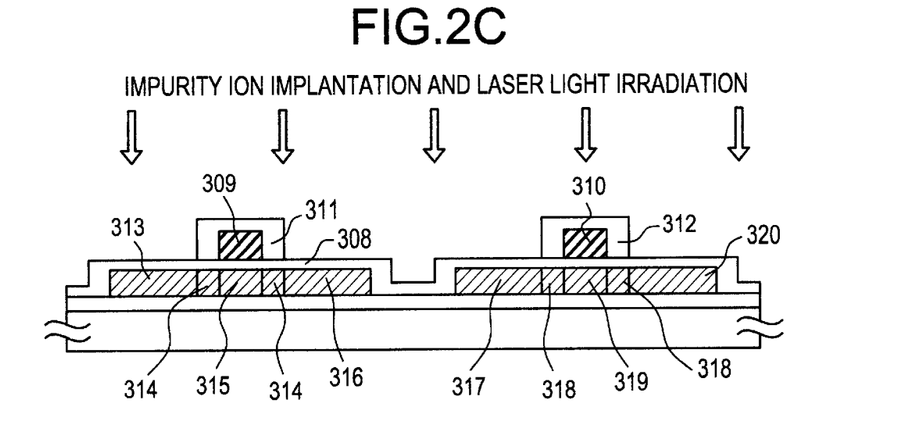

After forming an insulating film 308, an aluminum-based layer containing scandium is formed at a thickness of 6,000 Å, and the resulting film is patterned to form gate electrodes 309 and 310. Then, oxide layers 311 and 312 are formed by anodic oxidation in an electrolytic solution using the gate electrodes 309 and 310 as anodes. The oxide layers 311 and 312 are each formed at a thickness of about 2,000 Å. The thickness of the oxide layers 311 and 312 are necessary for forming offset regions in the later step of implanting impurity ions.

Impurity ions are implanted thereafter. This process comprises the steps of, implanting phosphorus ions while masking the right-hand side TFT with a resist, and then implanting boron ions while masking the left-hand side TFT. In this manner, a source region 313, a channel forming region 315, and a drain region 316 for the N-channel type TFT are formed in a self-alignment an offset region 314 is formed in a self-alignment. Similarly, a source region 317, a channel forming region 319, and a drain region 320 for the P-channel type TFT are formed in a self-alignment. An offset region 318 is formed in a self-alignment (FIG. 2C).

A laser light or an intense light is irradiated to effect annealing of the active layers which suffered damage on implanting impurity ions and to activate the implanted impurity ions. This step can be performed effectively by heating the specimen at 450 to 600° C.

Figure 2D:
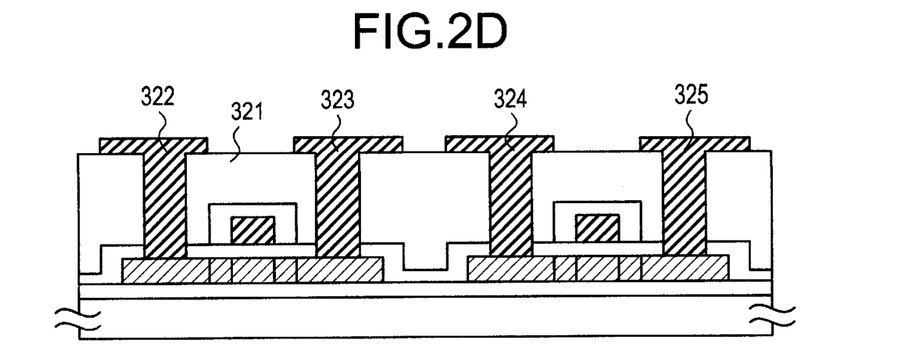

A silicon oxide film 321 is formed as an interlayer insulator at a thickness of 6,000 Å by plasma CVD. After forming a contact hole, aluminum is used to form a source electrode 322 and a drain electrode 323 for the N-channel TFT, as well as a source electrode 324 and a drain electrode 325 for the P-channel TFT. By heat treatment at 350° C. in gaseous hydrogen, N-channel and P-channel TFTs are obtained (FIG. 2D).

The TFT in the example are fabricated by using the monodomain regions, i.e., the regions regarded as single crystals, for the active layers of each of the TFTs. Thus, the TFTs are free of problems such as a fluctuation in threshold value or a change in characteristics with passage of time. Also, the TFT of the example can be operated at a high speed, and enables various types of thin film integrated circuits.

EXAMPLE 3

The present example refers to a constitution of a TFT provided to each of the pixels constituting an active matrix type liquid crystal display device. The steps for producing the TFT of the example are shown in FIGS. 3A to 3D.

Figure 3A:
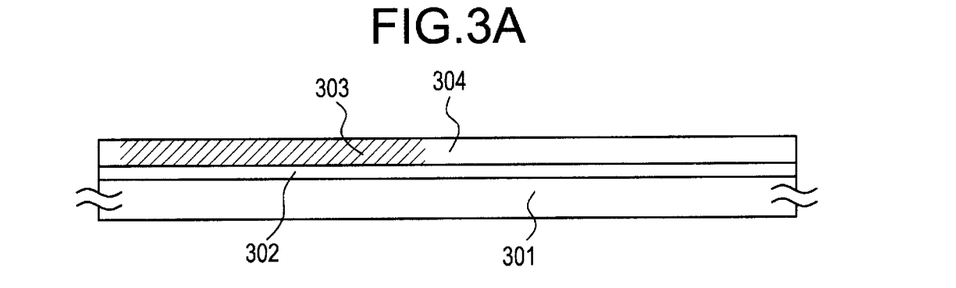
FIGS. 3A to 3D show the steps for fabricating a thin film transistor according to another embodiment.

By the process in Example 1, a silicon film having a monodomain region 303 is formed on a glass substrate 301 on which a base film 302 is formed (FIG. 3A).

Figure 3B:
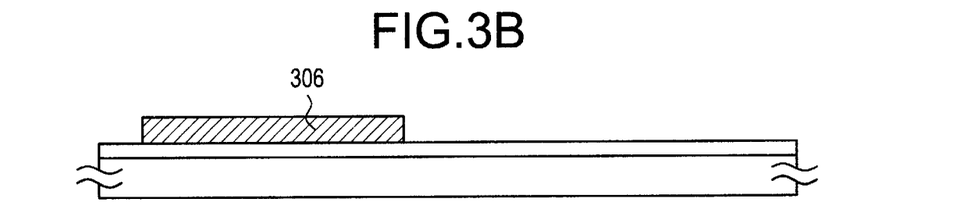

Then, by patterning, an active layer 306 for an N-channel TFT is formed using the monodomain region 303 (FIG. 3B).

Figure 3C:
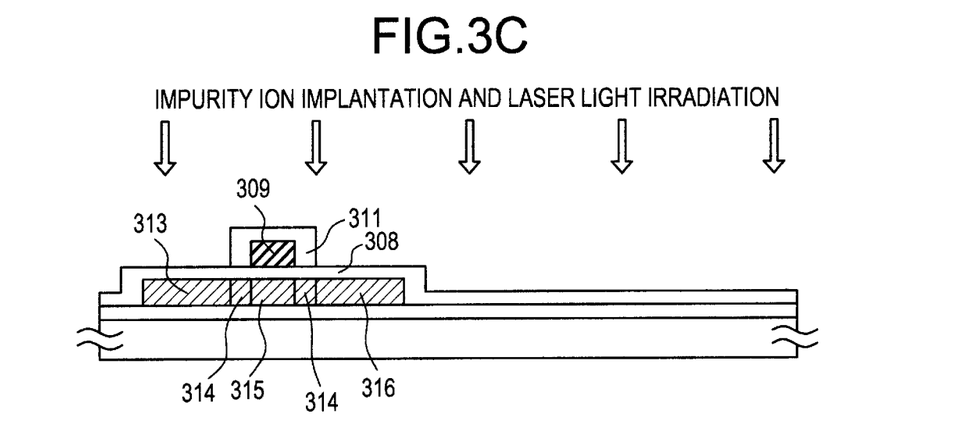

A silicon oxide film 308 is formed at a thickness of 1,000 Å by plasma CVD to provide a gate insulating film. An aluminum-based layer containing scandium is formed thereafter at a thickness of 6,000 Å by electron beam evaporation, and the resulting film is patterned to provide a gate electrode 309. Then, an oxide layer 311 is formed around the gate electrode 309 by anodic oxidation in an electrolytic solution using the gate electrode 309 as an anode. The oxide layer 311 functions as a mask in forming an offset region in the later step of impurity ion implantation. The oxide layer 311 has a thickness of about 2,000 Å.

Impurity ions are implanted thereafter. This process comprises the step of implanting phosphorus ions by ion doping to implant phosphorus ions into regions 313 and 316. In this manner, a source region 313 and a drain region 316 are formed in a self-alignment. Similarly, a channel forming region 315 and an offset region 314 is formed simultaneously in a self-alignment (FIG. 3C).

Figure 3D:
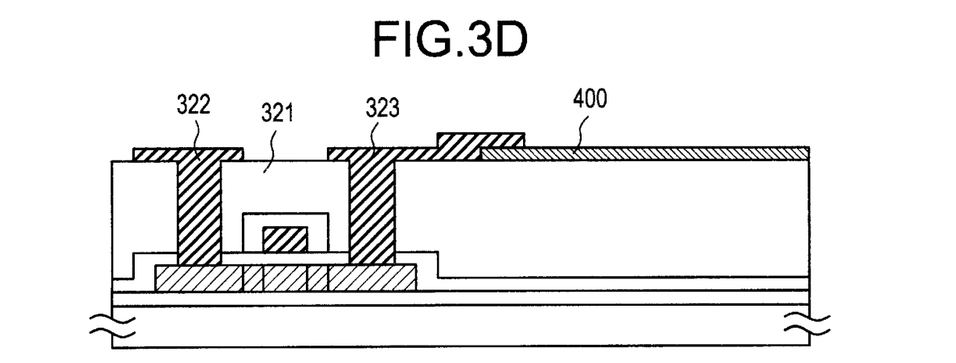

After annealing by irradiating a laser light or an intense light, a silicon oxide film 321 is formed as an interlayer insulator at a thickness of 6,000 Å. An ITO (indium tin oxide) electrode is formed as a pixel electrode. After forming a contact hole, aluminum is used to form a source electrode 322 and a drain electrode 323. The drain electrode 323 is connected to an ITO electrode 400 which is a pixel electrode (FIG. 3D).

The TFT in the example is fabricated by using a monodomain region substantially free of grain boundaries for the active layer of the TFT. Accordingly, OFF current due to the presence of grain boundaries can be greatly reduced. Thus, the example provides a TFT which is one of the suitable constitutions as a pixel electrode of an active matrix type liquid crystal display device.

EXAMPLE 4

Figure 4:
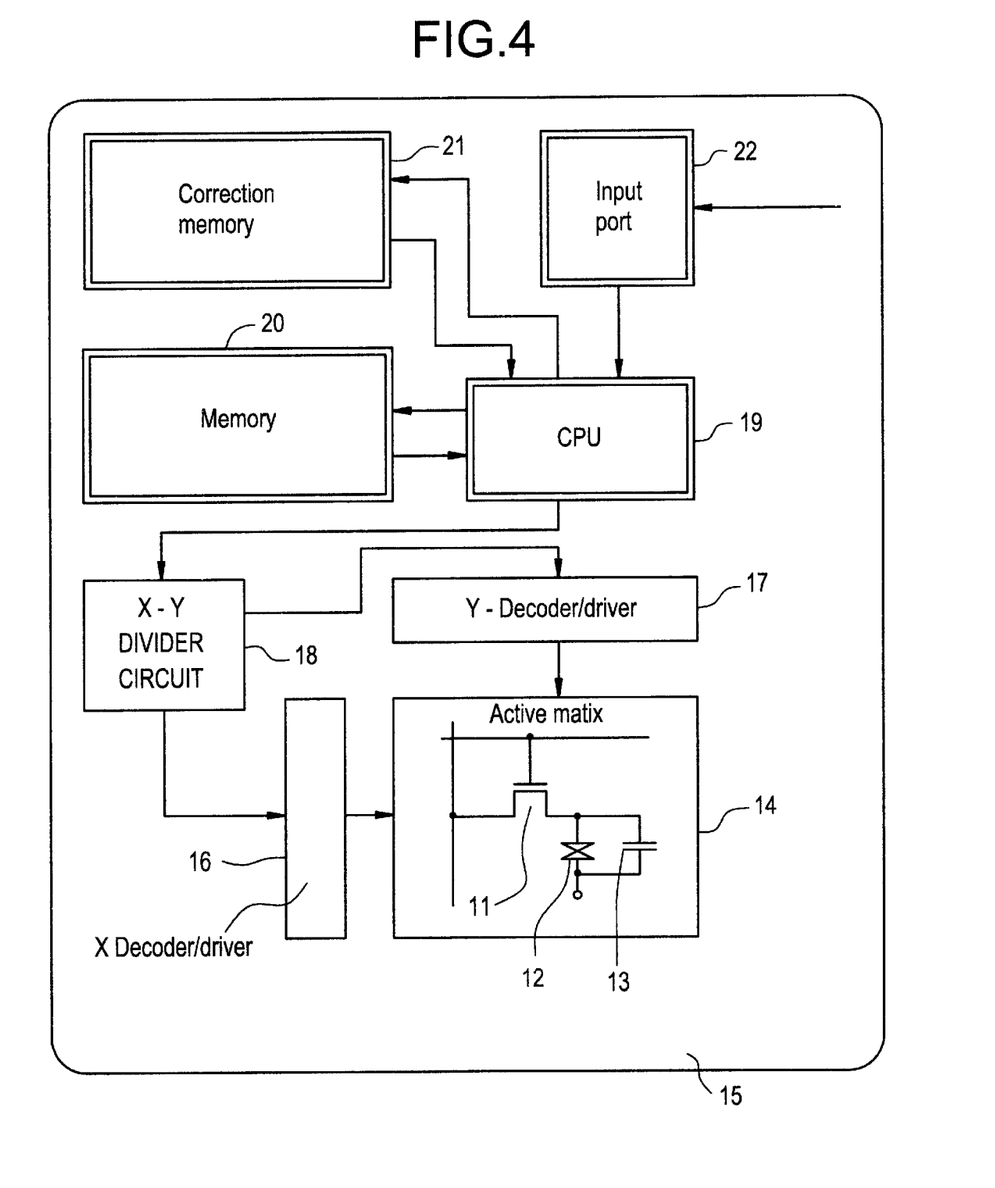
FIG. 4 schematically shows a constitution of a liquid crystal display system.

The present example refers to a case of fabricating a further advanced liquid crystal display system of an active matrix type according to the present invention with reference to FIG. 4. At present, a compact, light-weight, and thin liquid crystal display system is realized by fixing a semiconductor chip (IC) assembled in a common type main board of a computer to at least one of the substrates of a liquid crystal display device comprising a pair of substrates with a liquid crystal interposed therebetween. This constitution is employed because, in a TFT formed on a substrate having an insulating surface such as of glass, an integrated circuit having the characteristics capable of replacing the known IC chips is not available.

However, by using a TFT of the present invention, i.e., a TFT based on a monodomain region in which the influence of grain boundaries can be substantially neglected, high performance and stability are assured to provide an integrated circuit well comparable to the conventional IC chips.

The system according to the present example is described in FIG. 4. On a substrate 15 which is also the substrate of the liquid crystal display device, are formed an active matrix circuit 14 comprising a plurality of pixels each having a TFT 11, a pixel electrode 12, and an auxiliary capacitor 13, together with TFTs for driving the active matrix circuit 14, i.e., an X-decoder/driver 16, a Y-decoder/driver 17, and an X-Y divider circuit 18. A buffer circuit having a low output impedance must be arranged to the peripheral circuit in order to drive an active matrix circuit. In FIG. 4, the buffer circuit is provided with a TFT whose active layer is based on a monodomain region formed by the present invention. In this manner, a constitution having a high withstand voltage and which yet allows a large current can be implemented.

A thin film integrated circuit utilizing the TFT according to the present invention is formed on the substrate 15. Conventional integrated circuit chips are provided to the portions which are not replaced by a thin film integrated circuit. All of the integrated circuits may be replaced by thin film integrated circuits (the term "thin film integrated circuit" as referred herein signifies any integrated circuit formed by the thin film semiconductor formed on the surface of the substrate 15). Each of the integrated circuits and semiconductor chips is connected to the circuits formed on the substrate 15 by using a wiring pattern, wire bonding, COG (chip on glass), etc.

In FIG. 4, an input port 22 is a circuit which reads an externally input signal and converts the input signal to an image signal. A correction memory 21 is a memory intrinsic to the active matrix panel, and corrects the input signal and the like in accordance with the characteristics of the panel. In particular, the correction memory 21 is a non-volatile memory and stores the information inherent to each of the pixels in to correct the signal independently for each of the pixels.

In case a point defect is found in a pixel of the electro-optical device, correction signals are sent to the pixels around the defective pixel to compensate for the defect. In case a pixel is found to be darker than the surrounding pixels, a more intense signal is sent to the pixel to make the pixel yield the same brightness as that of the surrounding pixels. The information stored in the correction memory 21 differs from each other depending on the panel, because the defect information of the pixels differ from a panel to another.

A CPU (central processing unit) 19 and a memory 20 are the same as those used in an ordinary computer. In particular, the memory 20 is a RAM (random access memory) and stores image information corresponding to each of the pixels. These chips are all of a CMOS type.

As described above, it is particularly useful to set up an electronic device comparable to a simple personal computer by forming a CPU and a memory on a single liquid crystal display substrate, because not only a compact liquid crystal display system is realized, but also the application field can be expanded. Also, by forming all or a part of the integrated circuits on a substrate to provide a thin film integrated circuit using a thin film semiconductor, a further compact liquid crystal display device can be implemented to greatly increase the application field of the device.

An integrated circuit well comparable to an IC integrated on a single crystal wafer can be realized by using a TFT based on a monodomain region. Accordingly, as described in the example, the TFTs fabricated according to the present invention can be utilized in a circuit necessary for a liquid crystal display assembled in a system. In particular, it is particularly useful to employ the TFTs fabricated by utilizing the regions equivalent to single crystals (monodomain regions) in circuits where high withstand voltage and large current is applied, such as analog buffer circuits.

EXAMPLE 5

The present example refers to a TFT which comprises an active layer formed in a monodomain region other than a nickel silicide region. The TFT of the example is less influenced by the presence of nickel.

Figure 5A:
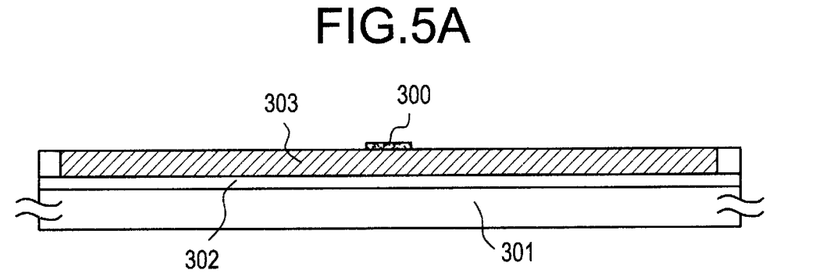
FIGS. 5A to 5D show the steps for fabricating a thin film transistor according to another embodiment.

FIGS. 5A to 5D show the steps of fabricating a TFT according to the example. By Example 1, a silicon film comprising a monodomain region 303 is formed on a glass substrate on which a base film 302 is formed previously (FIG. 5A).

In the monodomain region just below the nickel silicide layer 300 which functions as a crystal nucleus at this instance, nickel remains at a concentration higher than that in the peripheral regions. Accordingly, to lower the nickel concentration in the active layer of the TFT and the like, it is necessary to form the TFTs on regions other than those on which nickel silicide layer 300 is formed.

Figure 5B:
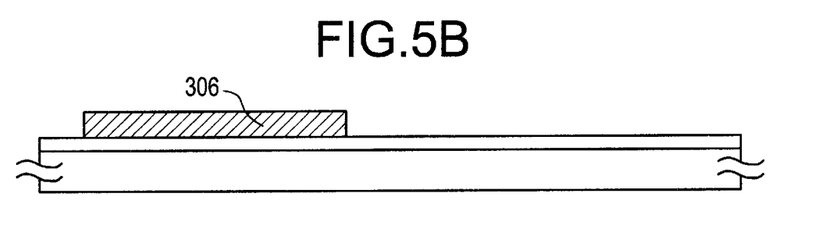

In the example, an active layer 306 of the TFT is formed by patterning a structure in FIG. 5A to obtain a state shown in FIG. 5B. The active layer 306 is formed in regions other than the nickel silicide regions 300.

Figure 5C:
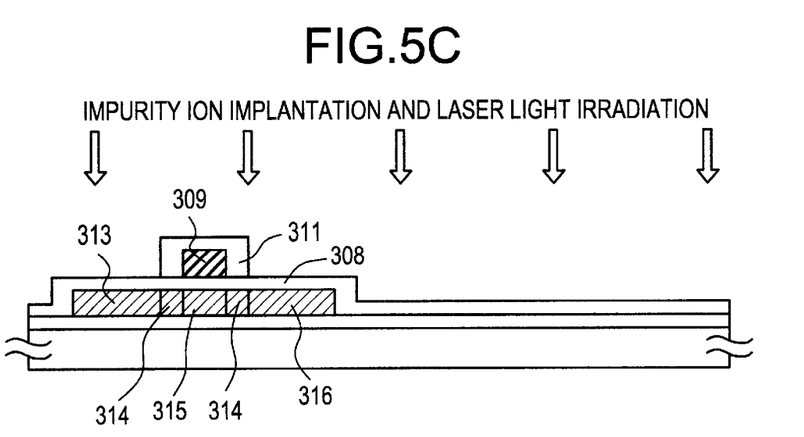

A silicon oxide film 308 is formed at a thickness of 1,000 Å by plasma CVD to provide a gate insulating film. An aluminum-based layer containing scandium is formed at a thickness of 6,000 Å, by electron beam evaporation, and the resulting film is patterned to provide a gate electrode 309. Then, an oxide layer 311 is formed around the gate electrode 309 by anodic oxidation in an electrolytic solution using the gate electrode 309 as an anode. The oxide layer 311 functions as a mask in forming an offset region in the later step of impurity ion implantation. The oxide layer 311 has a thickness of about 2,000 Å.

Impurity ions are implanted. This process comprises the step of implanting phosphorus ions by ion doping to implant phosphorus ions into regions 313 and 316. In this manner, a source region 313 and a drain region 316 are formed in a self-alignment. Also, a channel forming region 315 and an offset region 314 are formed simultaneously in a self-alignment (FIG. 5C).

Figure 5D:
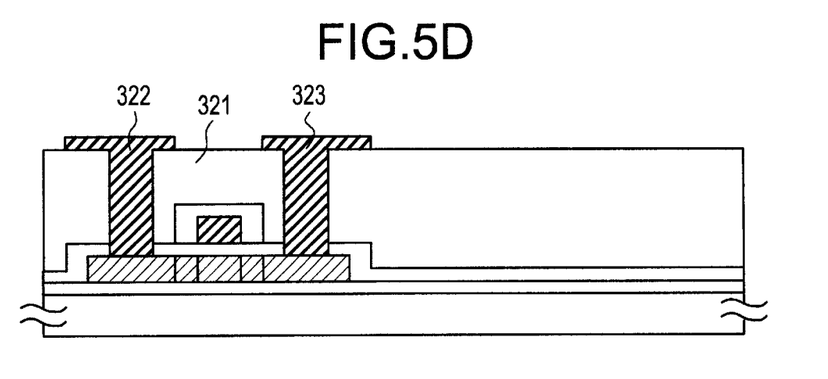

After the annealing step by irradiating a laser light or an intense light, a silicon oxide film 321 is formed as an interlayer insulator at a thickness of 6,000 Å. After forming a contact hole, aluminum is used to form a source electrode 322 and a drain electrode 323 (FIG. 5D).

The example yields a TFT having a constitution whose operation is less influenced by the metal element, because the active layer is formed on a region other than that into which a metal element is introduced to accelerate the crystallization of silicon. That is, by forming an active layer in regions other than those functioning as crystal nucleus, i.e., the region in which the silicide layer of the metal element for accelerating the crystallization is formed, a constitution free of regions containing the metal element at a high concentration can be excluded from the active layer.

EXAMPLE 6

The present example refers to a case of accelerating the crystallization of the amorphous silicon film by enhancing dehydrogenation (desorption of hydrogen) of the amorphous silicon film by plasma treatment.

In the example, plasma treatment using hydrogen plasma is applied to the surface of the amorphous silicon film in a step prior to that of FIG. 1A, i.e., in a step before that of coating the surface of the amorphous silicon film with a solution of nickel acetate. The plasma treatment comprises the steps of, producing hydrogen plasma by employing an ECR condition to gaseous hydrogen under a reduce pressure, and exposing the amorphous silicon film to the generated hydrogen plasma.

During the hydrogen plasma treatment, it is important to heat the amorphous silicon film at a temperature not higher than the crystallization temperature thereof. The crystallization temperature of amorphous silicon film differs depending on the method and the conditions of film formation. In general, the crystallization temperature is 600 to 650° C. The lower limit is about 400° C. Thus, heating is preferably performed in 400 to 600° C.

It is also useful to employ the deformation (distortion) point of the glass substrate as a standard in determining the upper limit of the heating temperature. More specifically, the heat treatment is effected at a temperature as high as possible but not exceeding the upper limit defined by the deformation temperature. By this method, a desired effect can be obtained while suppressing the unfavorable deformation or shrinking of the glass substrate.

During the hydrogen plasma treatment, hydrogen released from the amorphous silicon film combine with hydrogen ions in the plasma to form gaseous hydrogen. As a result, desorption of hydrogen from the film can be accelerated. Further, a stronger bond among silicon atoms is achieved to attain a higher ordering degree in the atomic arrangement. This state can be regarded as a quasi-crystalline state which easily undergoes crystallization.

An amorphous silicon can be crystallized by applying an energy by heating or laser light irradiation to the structure after subjecting it to plasma treatment. The crystallization can be effected with an extremely high reproducibility, and a film with considerably high crystallinity can be obtained, because the amorphous silicon film becomes an easily crystallizable state by plasma treatment.

Although a case of utilizing a hydrogen plasma is described above, a helium plasma is also usable. In case of using helium plasma, the high dissociation energy of helium is used. That is, the high plasma energy is utilized to cut the bond between silicon and hydrogen, so that the desorption of hydrogen from the silicon film might be accelerated.

The process for fabricating a semiconductor device according to the present invention comprises the steps of, forming monodomain regions by selectively providing a layer of a metal element which accelerates the crystallization of silicon or a layer containing the same on the surface of an amorphous silicon film provided on a substrate having an insulating surface, and crystallizing the amorphous silicon film by using the selectively provided layers as the crystal nucleus. High performance TFTs can be obtained by the TFTs using the above monodomain regions.

More specifically, the present invention provides TFTs which stably operate at high speed free of fluctuations in threshold values and of changes in characteristics with passage of time, and which are capable of operating with a high ON current but with a low OFF current.

What is claimed:

1. A display system comprising:
   a CPU formed over a substrate;
   a correction memory connected to said CPU, formed over said substrate;
   a memory connected to said CPU, formed over said substrate;

an X-Y divider circuit connected to said CPU, formed over said substrate;
an X-decoder/driver connected to said X-Y divider circuit, formed over said substrate;
a Y-decoder/driver connected to said X-Y divider circuit, formed over said substrate;
an active matrix circuit connected to each of said X-decoder/driver and said Y-decoder/driver, formed over said substrate;
wherein each of said X-Y divider circuit, said X-decoder/driver, said Y-decoder/driver is constituted by at least one thin film transistor, said thin film transistor comprising:
a crystalline semiconductor film on an insulating surface,
a channel region formed in said crystalline semiconductor film; and
source and drain regions formed in said crystalline semiconductor film,
wherein at least said channel region is substantially free of grain boundaries.

2. A display system according to claim 1 wherein a buffer circuit is formed in at least one of said X-Y divider circuit, said X-decoder/driver and said Y-decoder/driver.

3. A display system according to claim 1 wherein said channel region contains hydrogen or halogen element at a concentration $1 \times 10^{17}$ to $5 \times 10^{19}$ atoms/cm$^3$.

4. A display system comprising:
a CPU formed over a substrate;
a correction memory connected to said CPU, formed over said substrate;
a memory connected to said CPU, formed over said substrate;
an X-Y divider circuit connected to said CPU, formed over said substrate;
an X-decoder/driver connected to said X-Y divider circuit, formed over said substrate;
a Y-decoder/driver connected to said X-Y divider circuit, formed over said substrate;
an active matrix circuit connected to each of said X-decoder/driver and said Y-decoder/driver, formed over said substrate;
wherein each of said X-Y divider circuit, said X-decoder/driver, said Y-decoder/driver is constituted by at least one thin film transistor, said thin film transistor comprising:
a crystalline semiconductor film on an insulating surface,
a channel region formed in said crystalline semiconductor film; and
source and drain regions formed in said crystalline semiconductor film,
wherein at least said channel region is substantially free of grain boundaries;
wherein at least said channel region contains a crystallization promoting material at a concentration $1 \times 10^{14}$ to $1 \times 10^{19}$ atoms/cm$^3$.

5. A display system according to claim 4 wherein a buffer circuit is formed in at least one of said X-Y divider circuit, said X-decoder/driver and said Y-decoder/driver.

6. A display system according to claim 4 wherein said crystallization promoting material contains a metal selected from the group consisting of Fe, Co, Ni, Ru, Rh, Pd, Os, Ir, Pt, Cu and Au.

7. A display system according to claim 4 wherein said channel region contains hydrogen or halogen element at a concentration $1 \times 10^{17}$ to $5 \times 10^{19}$ atoms/cm$^3$.

8. A display system comprising:
a CPU formed over a substrate;
a correction memory connected to said CPU, formed over said substrate;
a memory connected to said CPU, formed over said substrate;
an X-Y divider circuit connected to said CPU, formed over said substrate;
an X-decoder/driver connected to said X-Y divider circuit, formed over said substrate;
a Y-decoder/driver connected to said X-Y divider circuit, formed over said substrate;
an active matrix circuit connected to each of said X-decoder/driver and said Y-decoder/driver, formed over said substrate;
wherein each of said X-Y divider circuit, said X-decoder/driver, said Y-decoder/driver is constituted by at least one thin film transistor, said thin film transistor comprising:
a crystalline semiconductor film on an insulating surface;
a channel region formed in said crystalline semiconductor film; and
source and drain regions formed in said crystalline semiconductor film,
wherein at least said channel region is substantially a single crystalline region.

9. A display system according to claim 8 wherein a buffer circuit is formed in at least one of said X-Y divider circuit, said X-decoder/driver and said Y-decoder/driver.

10. A display system according to claim 8 wherein said channel region contains hydrogen or halogen element at a concentration $1 \times 10^{17}$ to $5 \times 10^{19}$ atoms/cm$^3$.

11. A display system comprising:
a CPU formed over a substrate;
a correction memory connected to said CPU, formed over said substrate;
a memory connected to said CPU, formed over said substrate;
an X-Y divider circuit connected to said CPU, formed over said substrate;
an X-decoder/driver connected to said X-Y divider circuit, formed over said substrate;
a Y-decoder/driver connected to said X-Y divider circuit, formed over said substrate;
an active matrix circuit connected to each of said X-decoder/driver and said Y-decoder/driver, formed over said substrate;
wherein each of said X-Y divider circuit, said X-decoder/driver, said Y-decoder/driver is constituted by at least one thin film transistor, said thin film transistor comprising:
a crystalline semiconductor film on an insulating surface;
a channel region formed in said crystalline semiconductor film; and
source and drain regions formed in said crystalline semiconductor film,
wherein at least said channel region is substantially a single crystalline region,
wherein at least said channel region contains a crystallization promoting material at a concentration $1 \times 10^{14}$ to $1 \times 10^{19}$ atoms/cm$^3$.

12. A display system according to claim 11 wherein a buffer circuit is formed in at least one of said X-Y divider circuit, said X-decoder/driver and said Y-decoder/driver.

13. A display system according to claim 11 wherein said crystallization promoting material contains a metal selected from the group consisting of Fe, Co, Ni, Ru, Rh, Pd, Os, Ir, Pt, Cu and Au.

14. A display system according to claim 11 wherein said channel region contains hydrogen or halogen element at a concentration $1\times10^{17}$ to $5\times10^{19}$ atoms/cm$^3$.

15. A display system comprising:
a CPU formed over a substrate;
a correction memory connected to said CPU, formed over said substrate;
a memory connected to said CPU, formed over said substrate;
an X-Y divider circuit connected to said CPU, formed over said substrate;
an X-decoder/driver connected to said X-Y divider circuit, formed over said substrate;
a Y-decoder/driver connected to said X-Y divider circuit, formed over said substrate;
an active matrix circuit connected to each of said X-decoder/driver and said Y-decoder/driver, formed over said substrate;
wherein each of said X-Y divider circuit, said X-decoder/driver, said Y-decoder/driver is constituted by at least one thin film transistor, said thin film transistor comprising:
a crystalline semiconductor film on an insulating surface,
a channel region formed in said crystalline semiconductor film; and
source and drain regions formed in said crystalline semiconductor film,
wherein at least said channel region is a mono-domain region 16. A display system according to claim 15 wherein a buffer circuit is formed in at least one of said X-Y divider circuit, said X-decoder/driver and said Y-decoder/driver.

17. A display system according to claim 15 wherein said mono-domain region has no grain boundaries.

18. A display system according to claim 15 wherein said mono-domain region contains hydrogen or halogen element at a concentration $1\times10^{17}$ to $5\times10^{19}$ atoms/cm$^3$.

19. A display system comprising:
a CPU formed over a substrate;
a correction memory connected to said CPU, formed over said substrate;
a memory connected to said CPU, formed over said substrate;
an X-Y divider circuit connected to said CPU, formed over said substrate;
an X-decoder/driver connected to said X-Y divider circuit, formed over said substrate;
a Y-decoder/driver connected to said X-Y divider circuit, formed over said substrate;
an active matrix circuit connected to each of said X-decoder/driver and said Y-decoder/driver, formed over said substrate;
wherein each of said X-Y divider circuit, said X-decoder/driver, said Y-decoder/driver is constituted by at least one thin film transistor, said thin film transistor comprising:
a crystalline semiconductor film on an insulating surface,
a channel region formed in said crystalline semiconductor film; and
source and drain regions formed in said crystalline semiconductor film,
wherein at least said channel region is a mono-domain region;
wherein said mono-domain region contains a crystallization promoting material at a concentration $1\times10^{14}$ to $1\times10^{19}$ atoms/cm$^3$.

20. A display system according to claim 19 wherein a buffer circuit is formed in at least one of said X-Y divider circuit, said X-decoder/driver and said Y-decoder/driver.

21. A display system according to claim 19 wherein said mono-domain region has no grain boundaries.

22. A display system according to claim 19 wherein said mono-domain region contains hydrogen or halogen element at a concentration $1\times10^{17}$ to $5\times10^{19}$ atoms/cm$^3$.

23. A display system according to claim 19 wherein said crystallization promoting material contains a metal selected from the group consisting of Fe, Co, Ni, Ru, Rh, Pd, Os, Ir, Pt, Cu and Au.

24. A display system comprising:
a CPU formed over a substrate;
a correction memory connected to said CPU, formed over said substrate;
a memory connected to said CPU, formed over said substrate;
an X—Y divider circuit connected to said CPU, formed over said substrate;
an X—decoder/driver connected to said X—Y divider circuit, formed over said a Y—decoder/driver connected to said X—Y divider circuit, formed over said substrate;
an active matrix circuit connected to each of said X—decoder/driver and said Y—decoder/driver, formed over said substrate;
wherein said CPU is constituted by at least one thin film transistor, said thin film transistor comprising:
a crystalline semiconductor film on an insulating surface,
a channel region formed in said crystalline semiconductor film; and
source and drain regions formed in said crystalline semiconductor film,
wherein at least said channel region is substantially free of grain boundaries.

25. A display system accordingto claim 24 wherein said channel region contains hydrogen or halogen element at a concentration $1\times10^{17}$ to $5\times10^{19}$ atoms/cm$^3$.

26. A display system comprising:
a CPU formed over a substrate;
a correction memory connected to said CPU, formed over said substrate;
a memory connected to said CPU, formed over said substrate;
an X—Y divider circuit connected to said CPU, formed over said substrate;
an X—decoder/driver connected to said X—Y divider circuit, formed over said substrate;
a Y—decoder/driver connected to said X—Y divider circuit, formed over said substrate;
an active matrix circuit connected to each of said X—decoder/driver and said Y—decoder/driver, formed over said susbstrate;
wherein said CPU is constituted by at least one thin film transistor, said thin film transisor comprising:

a crystalline semiconductor film on an insulating surface;

a channel region formed in said crystalline semiconductor film; and source and drain regions formed in said crystalline semiconductor film, wherein at least said channel region is substantially a single crystalline region.

27. A display according to claim 26 wherein said channel region contains hydrogen or halogen element at a concentration $1 \times 10^{17}$ to $5 \times 10^{19}$ atoms/cm$^3$.

28. A display system comprising:

a CPU formed over a substrate;

a correction memory connected to said CPU, formed over said substrate;

a memory conneted to said CPU, formed over said substrate;

an X—Y divider circuit connected to said CPU, formed over said substrate;

an X—decoder/driver connected to said X—Y divider circuit, formed over said substrate;

a Y—decoder/driver connected to said X—Y divider circuit, formed over said substrate;

an active matrix circuit connected to each of said X—decoder/driver and said Y—decoder/driver, formed over said substrate;

wherein said memory is constituted by at least one thin film transistor, said thin film transistor comprising:

a crystalline semiconductor film on an insulating surface, a channel region formed in said crystalline semiconductor film; and source and drain regions formed in said crystalline semiconductor film, wherein at least said channel region is a mono-domain region.

29. A display system according to claim 28 wherein said channel region contains hydrogen or halogen element at a concentration $1 \times 10^{17}$ to $5 \times 10^{19}$ atoms/cm$^3$.

30. A display system comprising:

a CPU formed over a substrate;

a correction memory connected to said CPY, formed over said substrate;

a memory connected to said CPU, formed over said substrate;

an X—Y divider circuit connected to said CPU, formed over said substrate;

an X—decoder/driver connected to said X—Y divider circuit, formed over said substrate;

a Y—decoder/driver connected to said X—Y divider circuit, formed over said substrate;

an active matrix circuit connected to each of said X—decoder/driver and said Y—decoder/driver, formed over said substrate;

wherein said memory is constituted by at least one thin film transistor, said thin film transistor comprising:

a crystalline semiconductor film on an insulating surface, a channel region formed in said crystalline semiconductor film; and source and drain regions formed in said crystalline semiconductor film, wherein at least said channel region is substantially free of grain boundaries.

31. A display system according to claim 30 wherein said channel region contains hydrogen or halogen element at a concentration $1 \times 10^{17}$ to $5 \times 10^{19}$ atoms/cm$^3$.

32. A display system comprising:

a CPU formed over a substrate;

a correction memory connected to said CPU, formed over said substrate;

a memory connected to said CPU, formed over said substrate;

an X—Y divider circuit connected to said CPU, formed over said substrate;

an X—decoder/driver connected to said X—Y divider circuit, formed over said substrate;

a Y—decoder/driver connected to said X—Y divider circuit, formed over said substrate;

an active matrix circuit connected to each of said X—decoder/driver and said Y—decoder/driver, formed over said substrate;

wherein said memory is constituted by at least one thin film transistor, said thin film transistor comprising:

a crystalline semiconductor film on an insulating surface;

a channel region formed in said crystalline semiconductor film; and source and drain regions formed in said crystalline semiconductor film, wherein at least said channel region is substantially a single crystalline region.

33. A display system according to claim 32 wherein said channel region contains hydrogen or halogen element at a concentration $1 \times 10^{17}$ to $5 \times 10^{19}$ atoms/cm$^3$.

34. A display system comprising:

a CPU formed over a substrate;

a correction memory connected to said CPU, formed over said substrate;

a memory connected to said CPU, formed over said substrate;

an X—Y divider circuit connected to said CPU, formed over said substrate;

an X—decoder/driver connected to said X—Y divider circuit, formed over said substrate;

a Y—decoder/driver connected to said X—Y divider circuit, formed over said substrate;

an active matrix circuit connected to each of said X—decoder/driver and said Y—decoder/driver, formed over said substrate;

wherein said memory is constituted by at least one thin film transistor, said thin film transistor comprising:

a crystalline semiconductor film on an insulating surface, a channel region formed in said crystalline semiconductor film; and source and drain regions formed in said crystalline semiconductor film, wherein at least said channel region is a mono-domain region.

35. A display system according to claim 34 wherein said channel region contains hydrogen or halogen element at a concentration $1 \times 10^{17}$ to $5 \times 10^{19}$ atoms/cm$^3$.

36. A display system comprising:

a CPU formed over a substrate;

a memory connected to said CPU, formed over said substrate;

an X—Y divider circuit connected to said CPU, formed over said substrate;

an X—driver connected to said X—Y divider circuit, formed over said substrate;

a Y—driver connected to said X—Y divider circuit, formed over said substrate;

an active matrix circuit connected to each of said X—driver and said Y—driver, formed over said substrate;

wherein at least one of said CPU, said memory, said X—Y divider circuit, said X—driver and said Y—driver is constituted by at least one thin film transistor, said thin film transistor comprising:

a crystalline semiconductor film on an insulating surface, a channel region formed in said crystalline semiconductor film; and source and drain regions formed in said crystalline semiconductor film, wherein at least said channel region is a mono-domain region;

37. A display system according to claim 36 wherein said channel region contains hydrogen or halogen element at a concentration $1\times10^{17}$ to $5\times10^{19}$ atoms/cm$^3$.

38. A display system comprising:

a CPU formed over a substrate;

a memory connected to said CPU, formed over said substrate;

an X—Y divider circuit connected to said CPU, formed over said substrate;

an X—driver connected to said X—Y divider circuit, formed over said substrate;

a Y—driver connected to said X—Y divider circuit, formed over said substrate;

an active matrix circuit connected to each of said X—driver and said Y—driver, formed over said substrate;

wherein at least one of said CPU, said memory, said X—Y divider circuit, said X—driver and said Y—driver is constituted by at least one thin film transistor, said thin film transistor comprising:

a crystalline semiconductor film on an insulating surface, a channel region formed in said crystalline semiconductor film; and source and drain regions formed in said crystalline semiconductor film, wherein at least said channel region is substantially free of grain boundaries.

39. A display system according to claim 38 wherein said channel region contains hydrogen or halogen element at a concentration $1\times10^{17}$ to $5\times10^{19}$ atoms/cm$^3$.

40. A display system comprising:

a CPU formed over a substrate;

a memory connected to said CPU, formed over said substrate;

an X—Y divider circuit connected to said CPU, formed over said substrate;

an X—driver connected to said X—Y divider circuit, formed over said substrate;

a Y—driver connected to said X—Y divider circuit, formed over said substrate;

an active matrix circuit connected to each of said X—driver and said Y—driver, formed over said substrate;

wherein at least one of said CPU, said memory, said X—Y divider circuit, said X—driver and said Y—driver is constituted by at least one thin film transistor, said thin film transistor comprising:

a crystalline semiconductor film on an insulating surface, a channel region formed in said crystalline semiconductor film; and source and drain regions formed in said crystalline semiconductor film, wherein at least said channel region is substantially a single crystalline region.

41. A display system according to claim 40 wherein said channel region contains hydrogen or halogen element at a concentration $1\times10^{17}$ to $5\times10^{19}$ atoms/cm$^3$.

* * * * *